United States Patent
Ogimoto

(10) Patent No.: US 8,778,513 B2
(45) Date of Patent: Jul. 15, 2014

(54) PEROVSKITE MANGANESE OXIDE THIN FILM

(75) Inventor: Yasushi Ogimoto, Higashiyamato (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/816,738

(22) PCT Filed: Mar. 2, 2012

(86) PCT No.: PCT/JP2012/055344
§ 371 (c)(1),
(2), (4) Date: Apr. 9, 2013

(87) PCT Pub. No.: WO2012/140971
PCT Pub. Date: Oct. 18, 2012

(65) Prior Publication Data
US 2013/0189542 A1 Jul. 25, 2013

(30) Foreign Application Priority Data

Apr. 14, 2011 (JP) .................................. 2011-089724

(51) Int. Cl.
| | |
|---|---|
| C30B 29/22 | (2006.01) |
| C01G 45/02 | (2006.01) |
| C01G 45/12 | (2006.01) |
| C23C 14/00 | (2006.01) |
| C23C 14/08 | (2006.01) |
| C30B 23/02 | (2006.01) |
| H01L 21/02 | (2006.01) |
| H01L 29/04 | (2006.01) |
| H01L 29/24 | (2006.01) |
| H01L 45/00 | (2006.01) |

(52) U.S. Cl.
CPC ................ C01G 45/02 (2013.01); C01G 45/12 (2013.01); C01G 45/1264 (2013.01); C23C 14/0021 (2013.01); C23C 14/08 (2013.01); C30B 23/025 (2013.01); C30B 29/22 (2013.01); H01L 21/02197 (2013.01); H01L 21/02266 (2013.01); H01L 29/045 (2013.01); H01L 29/24 (2013.01); H01L 45/04 (2013.01); H01L 45/147 (2013.01)
USPC ........... 428/697; 428/700; 428/701; 428/702; 117/101

(58) Field of Classification Search
None
See application file for complete search history.

(56) References Cited

U.S. PATENT DOCUMENTS

| | | | |
|---|---|---|---|
| 5,665,664 | A | 9/1997 | Tomioka et al. |
| 6,136,457 | A | 10/2000 | Miyano et al. |

(Continued)

FOREIGN PATENT DOCUMENTS

| | | |
|---|---|---|
| EP | 0 864 538 A1 | 9/1998 |
| JP | 08-133894 A | 5/1996 |

(Continued)

OTHER PUBLICATIONS

Y. Kubo et al., "Epitaxial growth of A-site ordered SmBaMn$_2$O$_6$ thin films on Srtio$_3$(001) substrates by a pulsed laser deposition method", Extended Abstracts, Japan Society of Applied Physics and Related Societies, vol. 69, No. 2, 2008, 527.

(Continued)

Primary Examiner — David Sample
(74) Attorney, Agent, or Firm — Rabin & Berdo, P.C.

(57) ABSTRACT

An article including a perovskite manganese (Mn) oxide thin film, includes a substrate having an oriented perovskite structure that is (m10) oriented, where 19≥m≥2, and having an [100] axis direction; and a perovskite manganese (Mn) oxide thin film having a perovskite crystal lattice containing barium Ba and a rare earth element Ln in A sites of the perovskite crystal lattice, the perovskite manganese (Mn) oxide thin film being formed on the substrate so as to cover at least part of a surface of the substrate, and having atomic planes stacked in a pattern of LnO—MnO$_2$—BaO—MnO$_2$-LnO . . . in the [100] axis direction of the substrate. The perovskite manganese (Mn) oxide thin film provided thoroughly exploits the resistance changes caused by charge and orbital ordering in the perovskite manganese oxide.

6 Claims, 8 Drawing Sheets

(56) References Cited

U.S. PATENT DOCUMENTS

| | | |
|---|---|---|
| 2002/0030945 A1 | 3/2002 | Odagawa et al. |
| 2008/0217622 A1* | 9/2008 | Goyal ............................ 257/64 |
| 2013/0140661 A1* | 6/2013 | Ogimoto ...................... 257/421 |
| 2013/0149528 A1* | 6/2013 | Ogimoto ...................... 428/336 |
| 2013/0149556 A1* | 6/2013 | Ogimoto ...................... 428/700 |

FOREIGN PATENT DOCUMENTS

| | | |
|---|---|---|
| JP | 10-255481 A | 9/1998 |
| JP | 10-261291 A | 9/1998 |
| JP | 2002-094143 A | 3/2002 |
| JP | 2005-200271 A | 7/2005 |
| JP | 2005-213078 A | 8/2005 |
| JP | 2006-073629 A | 3/2006 |
| JP | 2008-156188 A | 7/2008 |
| WO | WO2009110872 A * | 9/2009 |

OTHER PUBLICATIONS

Yasushi Ogimoto et al., "Epitaxial growth of perovskite manganite thin films on high-index substrates", Extended Abstracts, Japan Society of Applied Physics and Related Societies, vol. 58, 2011. 03, 06-137, Ronbun No. 25P-BZ-14.

Yasushi Ogimoto et al., "Magnetic and transport properties of epitaxial manganite thin films on high-index substrates", Extended Abstracts, Japan Society of Applied Physics and Related Societies, vol. 58, 2011.03, 06-138, Ronbun No. 25P-BZ-15.

* cited by examiner (AO)

(BO$_2$)

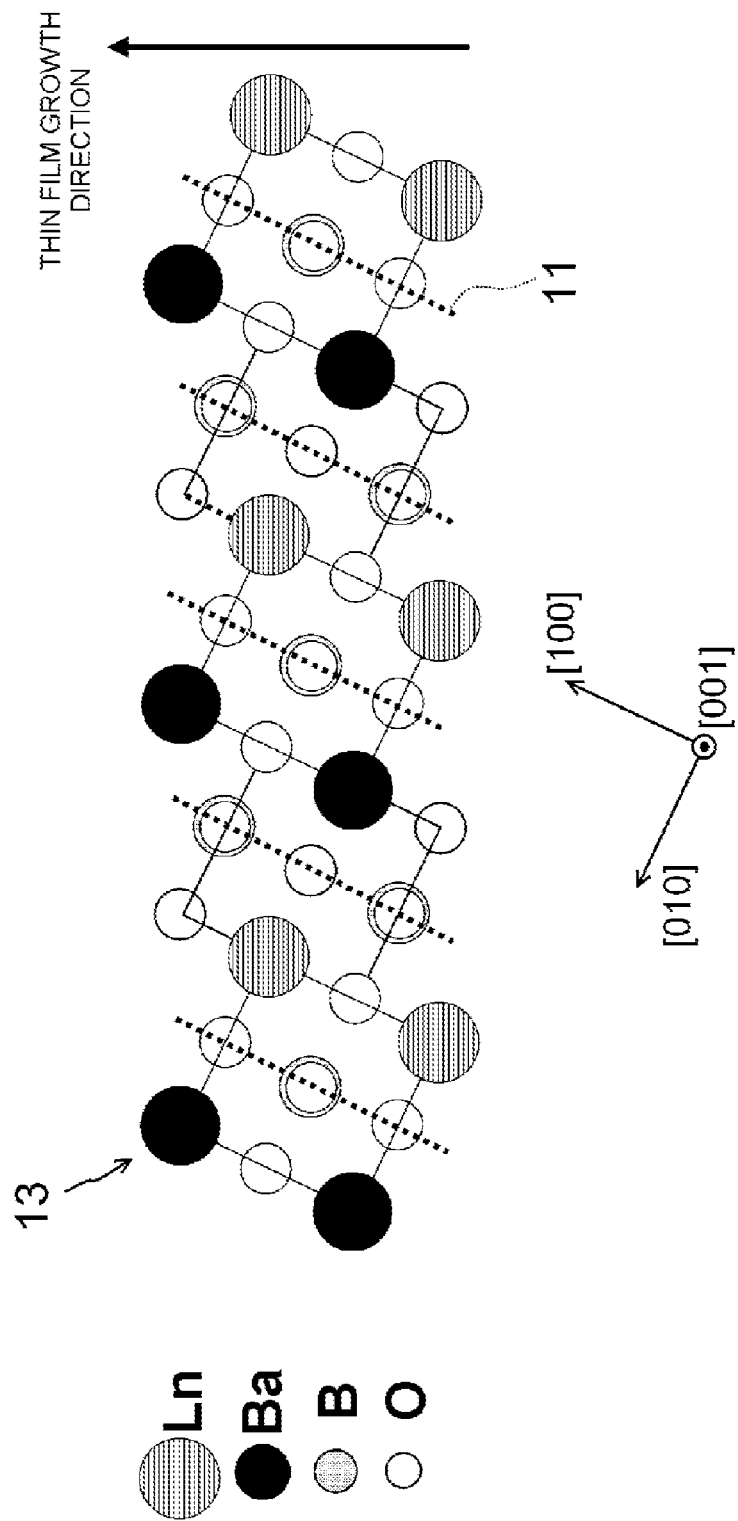

PEROVSKITE MANGANESE OXIDE THIN FILM

BACKGROUND OF THE INVENTION

1. Field of the Invention

The present invention relates to a perovskite manganese oxide thin film. More specifically, the present invention relates to a perovskite manganese oxide thin film, the electrical, magnetic or optical properties of which are switched in response to a stimulus such as temperature, electrical field, magnetic field or light exposure.

2. Background of the Related Art

There has been concern in recent years that semiconductor devices may be facing the limits of the scaling law, which has been a guiding principle of performance advances in the field. In this context, materials are being developed to enable new operating principles in order to weather the crisis when the transistor limit is reached. For example, in the field of spintronics, which exploits the spin degrees of freedom of electrons, development has been aimed at high-density non-volatile memories capable of high-speed operation at the same level as DRAM (dynamic random access memory).

There has also been progress in research into materials having strongly-correlated electron systems that cannot be described in terms of band theory, which is a cornerstone of semiconductor device design. Substances have been discovered that exhibit very large and rapid physical changes caused by phase transitions in the electron system. In strongly correlated electron system materials, a variety of electron phases with a variety of orders formed by spins, charges and orbitals are possible because the phase state of the electron system is affected not only by the spin degrees of freedom but also by the degrees of freedom of the electron orbitals. Typical examples of strongly correlated electron system materials are the perovskite manganese oxides, in which a first order phase transition produces a charge-ordered phase by alignment of 3d electrons of manganese (Mn) or an orbital-ordered phase by alignment of the electron orbitals.

In a charge-ordered phase or orbital-ordered phase, electrical resistance increases because the carrier is localized, and the electron phase becomes an insulator phase. The magnetic behavior of this electron phase is that of an antiferromagnetic phase due to the double exchange interactions. The electron states of the charge-ordered phase and orbital-ordered phase should often be regarded as semiconductor states. This is because although the carrier is localized in the charge-ordered phase or orbital-ordered phase, the electrical resistance is lower than that of a so-called band insulator. In accordance with convention, however, the electron phase of the charge-ordered phase or orbital-ordered phase is here called an insulator phase. Conversely, when the behavior is metallic with low resistance, the electron phase is a ferromagnetic phase because the spins are aligned. The term "metallic phase" is defined in various ways, but in the present application a metallic phase is one in which "the temperature derivative of resistivity is positively signed". Expressed in this way, the aforementioned insulator phase can be re-defined as one in which "the temperature derivative of resistivity is negative".

A variety of switching phenomena have reportedly been observed in bulk single-crystal materials made of substances capable of assuming either the aforementioned charge-ordered phase or orbital-ordered phase, or a phase that combines both a charge-ordered phase and an orbital-ordered phase (charge- and orbital-ordered phase) (Patent Document 1: Japanese Patent Application Publication No. H8-133894; Patent Document 2: Japanese Patent Application Publication No. H10-255481; and Patent Document 3: Japanese Patent Application Publication No. H10-261291). These switching phenomena occur in response to applied stimuli, namely, temperature changes around the transition point, application of a magnetic or electric field, or light exposure. These switching phenomena are typically observed as very large changes in electrical resistance and antiferromagnetic-ferromagnetic phase transitions. For example, resistance changes by orders of magnitude in response to application of a magnetic field are a well-known phenomenon called colossal magnetoresistance.

To achieve any device with a high degree of utility using a perovskite manganese oxide, these switching phenomena must be manifested at room temperature or above, such as an absolute temperature of 300 K or more. However, the switching phenomena disclosed in the aforementioned documents have all been verified only under low-temperature conditions of about liquid nitrogen temperature (77 K) or less for example. In the perovskite manganese oxides disclosed in the aforementioned documents, trivalent rare earth cations (hereunder represented as "Ln") and a divalent alkaline-earth ("Ae") randomly occupy the A sites in the perovskite crystal structure, and it is thought that the temperature at which the switching phenomena are manifested is lowered as a result of this randomness. It is known Second Substitute Specification (U.S. Nat. Stage of PCT/JP2012/055344) that the transition temperature for the charge-ordered phase can be elevated to about 500 K by ordering the A-site ions in an $AeO\text{-}BO_2\text{-}LnO\text{-}BO_2\text{-}AeO\text{-}BO_2\text{-}LnO\text{-}BO_2$ . . . configuration. Regular arrangement of the ions occupying the A sites as in this example is called "A-site ordering" below. A feature of the group of substances exhibiting such high transition temperatures is that they contain Ba (barium) as an alkaline-earth Ae. For example, transition temperatures above room temperature have been reported with substances containing Ba as an alkaline-earth Ae, and using Y (yttrium), Ho (holmium), Dy (dysprosium), Tb (terbium), Gd (gadolinium), Eu (europium) and Sm (samarium), which have small ionic radii, as a rare earth Ln.

For these switching phenomena to be applied to an electronic device, magnetic device or optical device, they must be manifested when the oxide has been formed as a thin film. Conventionally, the problem has been that even if a single crystal of perovskite manganese oxide is formed as a thin film on a (100) oriented substrate, the switching phenomena are not manifested in the resulting (100) oriented perovskite manganese oxide single-crystal thin film. This is due to suppression of a type of lattice deformation called Jahn-Teller deformation, which is required for the first order phase transition to a charge-ordered phase or orbital-ordered phase. This is due to the fact that the in-plane crystal lattice of the single-crystal thin film is fixed to the crystal lattice of the substrate in the plane of the substrate, and exhibits fourfold symmetry in the substrate plane.

On the other hand, Patent Document 4 (Japanese Patent Application Publication No. 2005-213078) discloses forming a perovskite oxide thin film formed using a (110) oriented substrate. According to this disclosure, the formed thin film allows shear deformation of the crystal lattice during switching when the in-plane fourfold symmetry of the (110) oriented substrate is broken. That is, in a thin film formed in accordance with Patent Document 4 the crystal lattice is oriented parallel to the substrate plane, while the charge-ordered plane or orbital-ordered plane is non-parallel to the substrate plane. As a result, first order phase transitions involving deformation of the crystal lattice are possible even with a single crystal thin film in which the in-plane crystal lattice is fixed to the in-plane lattice of the substrate. Thus, according to Patent Document 4, a transition or in other words a switching phenomenon at high temperatures equivalent to those obtained with the bulk single crystal can be achieved by using a (110) oriented substrate.

Patent Document 5 (Japanese Patent Application Publication No. 2008-156188) also discloses an example of such an A-site ordered perovskite manganese oxide, formed as a thin film. According to Patent Document 5, an amorphous thin film was formed by a photo-assisted deposition process, and then laser annealed to achieve crystallization and A-site ordering. Specifically, A-site ordering of a $SmBaMn_2O_6$ thin film formed on a (100) oriented $SrTiO_3$ substrate (lattice constant 0.3905 nm) was confirmed by electron beam diffraction.

However, the switching phenomena are suppressed in a single-crystal thin film of perovskite manganese oxide formed on a (100) oriented substrate. As a result, even if a substance or material exhibiting a charge-ordered phase within a temperature range suited to practical use (such as room temperature) can be prepared using single crystal bulk, it cannot immediately be applied to a device. Patent Document 5 does not disclose whether or not the thin film subjected to A-site ordering is a single-crystal thin film, but supposing it to be a polycrystalline film, or in other words a film comprising multiple grains with different crystal orientations on the same substrate, A-site ordering and charge and orbital ordering would then be impeded by lattice defects in the thin film. Thus, in the substance formed as a thin film in Patent Document 5 there is a concern of a decreased transition temperature or even the loss of the first order phase transition itself in extreme cases.

As in an ordinary semiconductor device, a single-crystal thin film must be prepared with few defects in order to achieve high-performance switching properties and uniform properties with a perovskite manganese oxide. One possible way of doing this is by using a (110) oriented substrate as disclosed in Patent Document 4 and the like. In a (110) oriented thin film formed using a (110) oriented substrate, the atomic stacking planes are arranged as $(Ln,Ba)BO-O_2-(Ln,Ba)BO$. This describes a stacked body of atomic layers with a repeating structure obtained by forming one atomic layer consisting of A sites containing Ba atoms or a rare earth element Ln in random pattern, B sites, and O atoms, and then forming an atomic layer containing two O atoms adjacent to this atomic layer. Thus, A-site ordering in a (110) oriented thin film must be in a plane parallel to the atomic stacking plane. However, some factor must provide a driving force for ordering the A-sites within the plane. In fact no such factor exists, and ordering the A sites of a (110) oriented thin film is not an easy matter.

One solution would be to use a (210) oriented substrate to form a (210) oriented perovskite manganese oxide film with a stacking structure of atomic stacking planes arranged in an $AO-BO_2-AO$ . . . configuration. This is because A-site ordering is easy in this stacked body of atomic planes, and the in-plane symmetry is also broken.

However, in a perovskite manganese oxide thin film grown on a (210) oriented substrate so that the atomic planes are arranged as $AeO-BO_2-LnO-BO_2$ . . . in the direction perpendicular to the substrate plane or in other words in the direction of [210] axis, the charge- and orbital-ordered plane is inclined at a large angle to the substrate plane in the formed crystal lattice as discussed below with reference to FIGS. 7 and 8. Therefore, the inventor of this application realized that if the aim is to use the resistance change resulting from an insulator-metal transition or other switching phenomenon, the usable resistance change is not sufficient in such a perovskite manganese oxide thin film.

That is, in a perovskite manganese oxide thin film grown on a (210) oriented substrate in a direction perpendicular to the substrate plane, the angle of the charge- and orbital-ordered plane 11 (FIG. 8) relative to the substrate plane exceeds 45 degrees. Specifically, the angle θ1 of the charge- and orbital-ordered plane or in other words the (010) plane relative to the (210) plane (substrate plane) is given by substituting m=2 in the following formula:

$$\theta 1 = \arccos(1/(1+m^2)^{1/2}) \quad \text{Formula 1,}$$

resulting in a value of about 63.4 degrees for θ1. Therefore, if the aim is to use the change in electrical properties caused by the insulator-metal transition as a change in electrical resistance in the direction of film thickness, the charge- and orbital-ordered plane 11 becomes a current pathway because it is formed with an aspect close to the direction of flow of the carrier. That is, the problem is that with this aspect of the charge- and orbital-ordered plane the resistance change generated by the insulator-metal transition is reduced, and the usable resistance change may be too small when the perovskite manganese oxide thin film is used as a device.

SUMMARY OF THE INVENTION

The present invention was developed in light of these problems. That is, the present invention contributes to the preparation of various devices using perovskite manganese oxide thin films by providing a perovskite manganese oxide thin film that both (1) allows first order phase transitions, and (2) achieves A-site ordering (features which are necessary for switching operations at room temperature), while also (3) thoroughly exploiting the resistance changes accompanying the appearance and extinction of the charge- and orbital-ordered phase.

After close examination of these problems with a focus on the relationship between the atomic stacking planes and the growth direction of the perovskite manganese oxide thin film, the inventor of this application discovered means for solving these problems. The problem of the large inclination of the charge- and orbital-ordered plane relative to the substrate plane is solved by appropriately controlling the direction of crystal growth.

That is, one mode of the present invention provides a perovskite manganese (Mn) oxide thin film containing barium Ba and a rare earth element Ln in A sites of the perovskite crystal lattice, wherein the perovskite manganese oxide thin film is formed covering at least part of the surface of a substrate having an (m10) oriented (19≥m≥2) perovskite structure and have atomic planes stacked in a pattern of $LnO-MnO_2-BaO-MnO_2-LnO$ . . . in the [100] axis direction of the substrate. Thus, provided is an article including a perovskite manganese (Mn) oxide thin film, comprising: a substrate having an oriented perovskite structure that is (m10) oriented, where 19≥m≥2, and having an [100] axis direction; and a perovskite manganese (Mn) oxide thin film having a perovskite crystal lattice comprised of barium Ba and a rare earth element Ln in A sites of the perovskite crystal lattice, the perovskite manganese (Mn) oxide thin film being formed on the substrate so as to cover at least part of a surface of the substrate, and having atomic planes stacked in a pattern of $LnO-MnO_2-BaO-MnO_2-LnO$ . . . in the [100] axis direction of the substrate.

In this mode, the atomic stacking plane is $AO-BO_2-AO$ . . . in the [100] axis direction. It is thus possible to order the Mn and the Ln in the A sites while growing the thin film in the [100] axis direction. Moreover, first order phase transitions, which were suppressed in a thin film formed on a (100) oriented substrate, are possible because the symmetry of the formed film is broken in the plane of the substrate. In addition, the charge- and orbital-ordered plane in the insulator phase of the formed thin film is located in the parallel range of the substrate plane. That is, the charge- and orbital-ordered plane is a (100) plane, and is inclined at an angle of no more than 45 degrees to the substrate plane. In the present application, saying that the charge- and orbital-ordered plane is "in the parallel range" of the substrate plane means that the charge- and orbital-ordered plane is inclined at an angle of more than 0 but less than 45 degrees relative to the substrate plane. On the other hand, saying that the charge- and orbital-ordered plane is "in the perpendicular range" of the substrate plane means that the charge- and orbital-ordered plane is inclined at an angle of more than 45 but less than 90 degrees relative to the substrate plane.

In a perovskite crystal lattice represented as $ABO_3$, considered as a cube or more generally as a parallelepiped having the oxygen atoms of an oxygen octahedral in the face centers, the A sites are the lattice points located at the vertices of the cube or the like.

Looking more specifically at the angle of the aforementioned charge- and orbital-ordered plane or in other words the (100) plane, the angle θ relative to the substrate plane ((m10) plane) is determined by Formula 2:

$$\theta = \arctan(1/m) \quad \text{Formula 2.}$$

The relationship between the angle θ1 calculated by Formula 1 and the angle θ calculated by Formula 2 becomes θ=(180−90−θ1)=(90−θ1). That is, θ1 and θ are each other's complementary angles.

An (m10) oriented substrate here means a substrate in which the substrate plane is an (m10) plane. The substrate plane here is the flat plane on which the noticeable surface of the substrate generally extends. For example, when some microscopic structure is formed on the noticeable surface of the substrate, the substrate plane is the crystal plane demarcating the surface of the substrate as a whole, discounting the aspect of the individual planes demarcating the microscopic structure. Moreover, miscut angles and other divergences in orientation caused by uncorrected errors in manufacture are allowed for purposes of determining the substrate plane. To explain the (m10) oriented substrate in terms of a specific example, an (m10) orientation here means the orientation of a crystal lattice (hereunder called an "orientation") formed so that the Miller index specifying the film plane or in other words the surface of the thin film parallel to the substrate plane is (m10). In this mode of the invention, m is selected from the range of 19≥m≥2. When m=2, an (m10) oriented substrate is a substrate oriented with the (210) plane as the substrate plane. That is, it is a substrate with a plane orientation such that the (100) plane is inclined at an angle of about 26.6 degrees around the [001] axis contained in that plane (in-plane [001] axis). In an (m10) oriented substrate, the angle of the (100) plane relative to the substrate plane is given by Formula 2, which is a general formula for (m10) planes. As m increases, the (100) plane in an (m10) oriented substrate becomes more nearly parallel to the thin film surface or substrate plane. As shown here, although the thin film plane is specified in terms of a plane index, it can also be specified in terms of an angle (called an off angle) when the incline of the substrate plane is slight. This correspondence is given by Formula 2. In particular, the upper limit of m works out to 19≥m. This upper limit of m corresponds to a number that gives a value larger than 3 degrees for the off angle (angle θ) of the (100) plane. This is because it has been confirmed experimentally that the lattice deformation necessary for a first order phase transition is suppressed if the off angle is 3 or less. If m=19, θ is about 3.013 degrees.

A mode of the present invention also provides a perovskite manganese oxide thin film in which the substrate is a (210) oriented substrate.

The configuration of this mode provides the easiest way to order the A sites while growing the thin film in the [100] axis direction. The (m10) plane is equivalent to the (010) plane inclined in a certain direction around the in-plane [001] axis so as to satisfy Formula 1 as discussed above, or put in a different way, to the (100) plane inclined in the opposite direction so as to satisfy Formula 2. In this case, the crystal lattice in the in-plane [001] axis direction is no different than with a (100) oriented substrate, but in the [1-m0] axis direction perpendicular to the in-plane [001] axis, the terrace width formed by the (100) plane is increased for each increase in m. As a result, crystal growth is difficult if m is too large. Thus, the most desirable orientation from the standpoint of thin-film preparation is the (210) orientation, which has the smallest index.

Moreover, a mode of the present invention provides the aforementioned perovskite manganese oxide thin film, wherein the substrate is a $SrTiO_3$ (210) oriented substrate having undulated structures comprising steps formed by planes with a first aspect extending in the in-plane [001] axis direction and terraces formed by the (100) plane with a different aspect from the first aspect on the surface on which the perovskite manganese oxide thin film is formed. Thus, when the substrate is comprised of $SrTiO_3$ and is a $SrTiO_3$ (210) oriented substrate, the substrate has an undulated structure on the surface on which the perovskite manganese (Mn) oxide thin film is formed, the undulated structure comprising steps formed by planes that have a first aspect extending in an in-plane [001] axis direction; and terraces formed by (100) planes that have an aspect that is different from the first aspect.

With the configuration of this mode, it is easy to stack A-site ordered atomic planes as $LnO$—$MnO_2$—$BaO$—$MnO_2$-$LnO$ . . . in the [100] axis direction on the (100) plane terraces. This is because the surface structures formed by the (100) plane terraces and the steps parallel to the in-plane [001] axis direction on the $SrTiO_3$ (210) oriented substrate can be used as a template for forming the thin film thereon. In other words, since the conditions for growing a thin film on the (100) plane are the same as for (100) plane growth on a $SrTiO_3$ (100) oriented substrate, preparing a thin film on a (210) oriented substrate should be as easy as preparing a thin film on a (100) oriented substrate.

Moreover, a mode of the present invention provides that the aforementioned perovskite manganese (MnO) oxide thin film is represented by a chemical formula $SmBaMn_2O_6$.

With the configuration of this mode, it is possible to prepare a thin film whereby a charge- and orbital-ordered phase can be obtained at near room temperature (about 380 K) in modes of the invention discussed above.

All modes of the present invention provide an A-site ordered perovskite manganese oxide thin film exhibiting a transition temperature to a charge-ordered phase or orbital-ordered phase at room temperature or above, whereby the resistance changes accompanying switching by appearance and extinction of the charge- and orbital-ordered phase can be thoroughly exploited, and wherein the charge- and orbital-ordered plane is formed in the parallel range of the substrate plane.

BRIEF DESCRIPTION OF THE DRAWINGS

FIG. 2 is a side view showing the (210) oriented crystal lattice in a cubic perovskite structure common to the substrate and perovskite manganese oxide thin film in an embodiment of the present invention, wherein

FIG. 3 is a horizontal cross-section showing the atomic arrangement of the atomic layers in the plane of the substrate in the crystal lattice of the substrate and perovskite manganese oxide thin film of an embodiment of the present invention, shown with respect to two planes parallel to the substrate plane and thin film surface, wherein

FIG. 4 shows the surface structure of an $SrTiO_3$ (210) oriented substrate following annealing for 12 hours in atmosphere at 1100° C. in an embodiment of the present invention, wherein

FIG. 5 is a side view of the crystal lattice of an A-site ordered $LnBaMn_2O_6$ thin film comprising atomic planes containing a rare earth element Ln, the alkaline-earth barium Ba and oxygen O in the A sites, stacked in a pattern of LnO—$MnO_2$—BaO— . . . in the [100] axis direction in an embodiment of the present invention, wherein

FIG. 7 is a side view of the crystal lattice of an $LnBaMn_2O_6$ thin film of a comparative example with the A sites ordered in the [100] axis direction, comprising atomic planes containing the rare earth element Ln and the alkaline-earth barium Ba in the A sites, stacked in a pattern of LnO—$MnO_2$—BaO . . . in the [210] axis direction, wherein FIG. 8 is a side view showing an enlargement of part of the crystal lattice of an $LnBaMn_2O_6$ thin film of a comparative example grown in the [210] axis direction on an $SrTiO_3$ (210) oriented substrate.

DETAILED DESCRIPTION OF THE INVENTION

Figure 1:
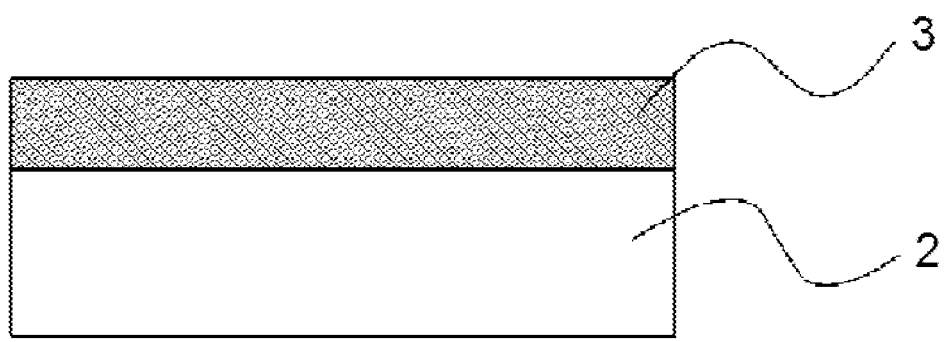
FIG. 1 is a schematic cross-section of a perovskite manganese oxide thin film formed on a substrate in one embodiment of the present invention.

Embodiments of the perovskite manganese oxide thin film of the present invention are explained below. Unless specifically mentioned in the explanations below, parts or elements that are common to all drawings are represented by the same reference symbols. In the drawings, the elements of the various embodiments are not necessarily shown to the same scale.

First Embodiment

This embodiment is explained using the example of a thin film 3 formed of the cubic perovskite manganese oxide $SmBaMn_2O_6$ (charge- and orbital-ordering transition temperature about 380 K), which has a small lattice mismatch with the substrate 2, formed on a substrate 2 which is a cubic perovskite oxide substrate of $SrTiO_3$, corresponding to a case of m=2 in a (m10) oriented substrate (hereunder called a "$SrTiO_3$ (210) oriented substrate). The structure of the thin film is explained first based on this specific example, the method of fabricating this film is explained next, and then the charge- and orbital-ordered plane formed in the parallel range of the substrate plane and its effects are explained based on examples and comparative examples.

(1) Structure:

FIG. 1 shows a cross-section of a thin film 3 formed on the substrate 2, which is a $SrTiO_3$ (210) oriented substrate. Thin film 3 is formed so as to cover at least part of the (210) oriented surface of the substrate 2. As discussed below, the resistance value in the direction of film thickness is measured with the thin film 3. For this reason, a 60 μm diameter Au—Pd electrode (not shown) is formed by sputtering on the surface of the thin film 3. Using a Nb-doped $SrTiO_3$ (210) oriented substrate as the substrate 2, an Al electrode (not shown) is vapor deposited on the reverse surface of this substrate. These electrodes are the measurement electrodes.

(1-1) (210) Oriented Perovskite Structure:

Next, the (210) plane orientation in the cubic perovskite structure used for the substrate 2 and thin film 3 is explained. The perovskite structure is represented as $ABO_3$, with A occupying the vertices, B the body center and O (oxygen) the face centers. In explaining each embodiment, the vertex sites are called A sites, and the atoms occupying them are called A atoms. The atom occupying the B site in the body center is similarly called a B atom. In the context of this embodiment the perovskite structure is explained in terms of a cubic crystal, but this is only for purposes of convenience. Perovskite structures encompassed by this embodiment include not only cubic but also tetragonal, orthorhombic and monoclinic structures and the like, in which the aforementioned A, B and O atoms are arranged at any positions in a crystal lattice with any deformations. Also, for example substances with crystal structures in which the basic unit lattice is only obtained by linking a plurality of the unit cells discussed above are also included in this embodiment.

Figure 2A:
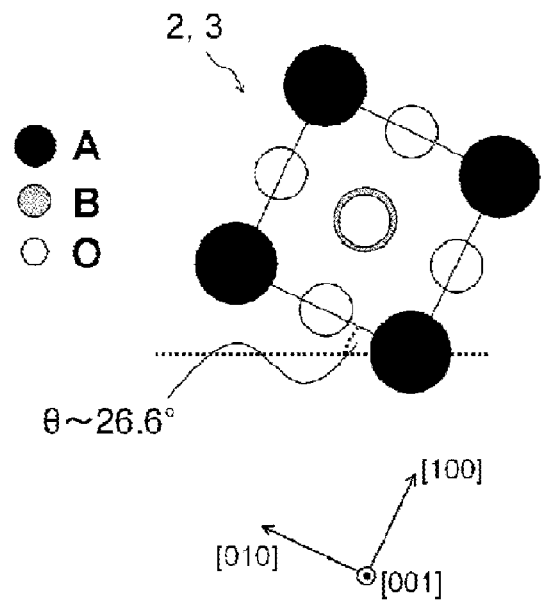
FIG. 2A is a side view seen from the in-plane [001] axis.
Figure 2B:
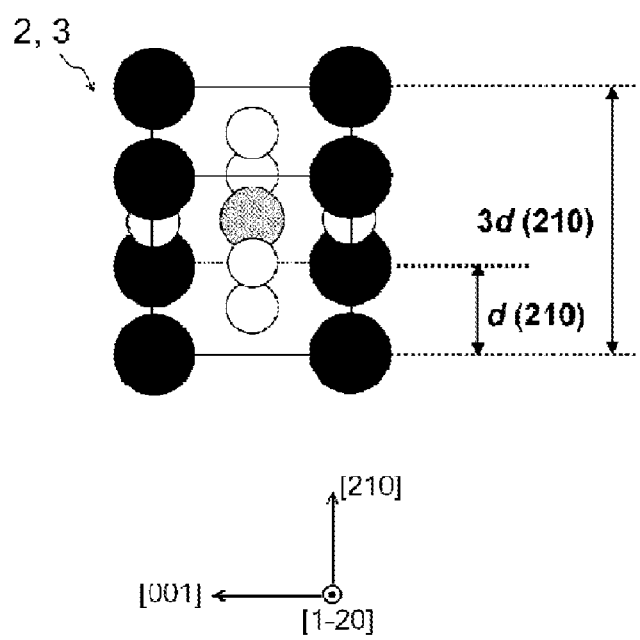
FIG. 2B is a side view seen from the in-plane [1-20] axis.

FIG. 2 is a side view showing the (210) oriented crystal lattice in a cubic perovskite structure common to the substrate 2 and the thin film 3. FIG. 2a is a side view seen from the in-plane [001] axis, and FIG. 2b is a side view seen from the in-plane [1-20] axis. Both side views in FIG. 2 are drawn with the substrate plane extending to the right and left on the paper, and the direction perpendicular to the substrate plane ([210] axis; hereunder called the "direction perpendicular to the plane") extending up and down on the paper. FIG. 3 is a cross-section of the atomic arrangement of each atomic layer in the (210) plane or in other words in the plane of the substrate. In FIG. 3, the vertical direction on the paper is the in-plane [001] axis, and the horizontal direction is the in-plane [1-20] axis.

As shown in FIG. 2, the unit cell of the (210) oriented cubic perovskite structure used in this embodiment is formed at an angle to the substrate plane, which extends to the left and right in the figure. Specifically, the (210) plane of the unit cell is parallel to the substrate plane, while the (100) plane forms an angle of about 26.6 degrees with the substrate plane ((210) plane) as shown by Formula 2. As a result, the arrangement of each atomic layer in a plane parallel to the substrate plane in a (210) oriented perovskite structure is as shown in FIG. 3. That is, in a (210) oriented perovskite structure the atomic planes are stacked as AO-BO$_2$-AO . . . in an alternating pattern of AO atomic layers and BO$_2$ atomic layers in the direction perpendicular to the plane.

In an SrTiO$_3$ (210) oriented substrate, the lattice spacing d(210) between (210) planes in the direction perpendicular to the plane as given by:

$$d(210)=a\cdot\sin\theta \quad \text{Formula 3,}$$

(wherein a is the lattice constant of SrTiO$_3$ (=0.3905 nm)) is about 0.1746 nm. Considering that the cubic unit cell is inclined at an angle of about 26.6 degrees from the (100) plane orientation, the spacing in the direction perpendicular to the plane is 3d(210) or about 0.5238 nm. Taking into account the periodicity of the in-plane atomic positioning, the length in the direction perpendicular to the plane is 5d(210) or about 0.873 nm.

Figure 3A:
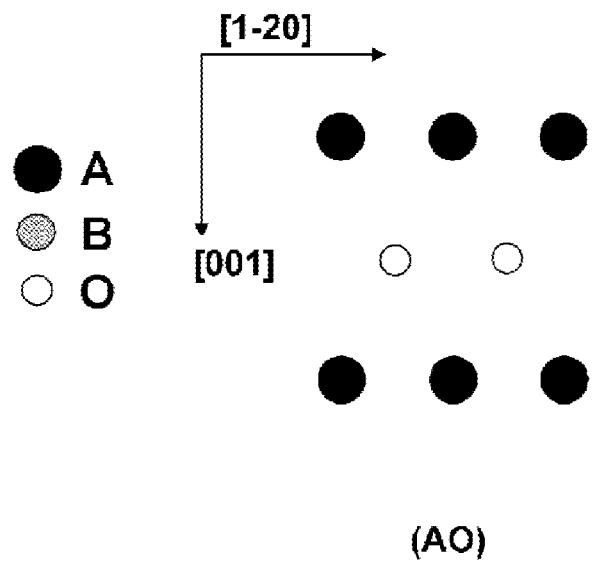
FIG. 3A is a cross-section on a plane containing A-site atoms and O (oxygen) atoms.
Figure 3B:
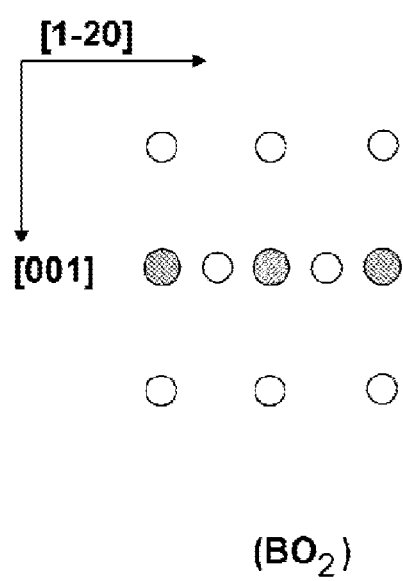
FIG. 3B is a cross-section on a plane containing B-site atoms and O atoms.

FIG. 3A is the AO layer and FIG. 3B is the BO$_2$ layer. In the substrate 2, which is a SrTiO$_3$ (210) oriented substrate, and the thin film 3 formed on the (210) plane of the substrate 2, the lattice spacing in the in-plane [001] axis direction is the same as in the (100) plane. By contrast, the lattice spacing in the in-plane [1-20] axis direction is greater than in the (100) plane. In terms of the symmetry in the plane of the substrate in the substrate 2 and thin film 3 (hereunder called the "in-plane symmetry), moreover, the centrosymmetry is effectively broken. This is because the crystal lattice of the substrate 2 or thin film 3 is non-symmetric with respect to the in-plane [1-20] axis when using a (210) oriented substrate. That is, the symmetry produced by fourfold symmetry as seen with a (100) oriented substrate is broken when using a (210) oriented substrate. This is why a first order phase transition of the thin film 3 is possible when using a (210) plane in an ABO$_3$ cubic perovskite crystal.

(1-2) Surface Structure of SrTiO$_3$ (210) Oriented Substrate:

Next, the undulated structures comprising steps formed by planes with a first aspect extending in the in-plane [001] axis direction on the surface of the substrate 2, which is the SrTiO$_3$ (210) oriented substrate and terrace parts formed by (100) planes with a different aspect from the first aspect on the surface on which the perovskite manganese oxide thin film is formed are explained. As-purchased SrTiO$_3$ (210) oriented substrate does not have a stepped surface unlike in the case of a (100) oriented substrate of the same material. As a result, the surface of the as-purchased SrTiO$_3$ (210) oriented substrate is flat on a nanometer scale, with no particular regular structures. However, undulated structures are formed on the surface of a substrate 2 obtained by annealing this SrTiO$_3$ (210) oriented substrate for 12 hours in atmosphere at an achieved substrate temperature of 1100° C. These undulated structures comprise steps extending in the in-plane [001] axis direction and (100) plane terraces.

Figure 4A:
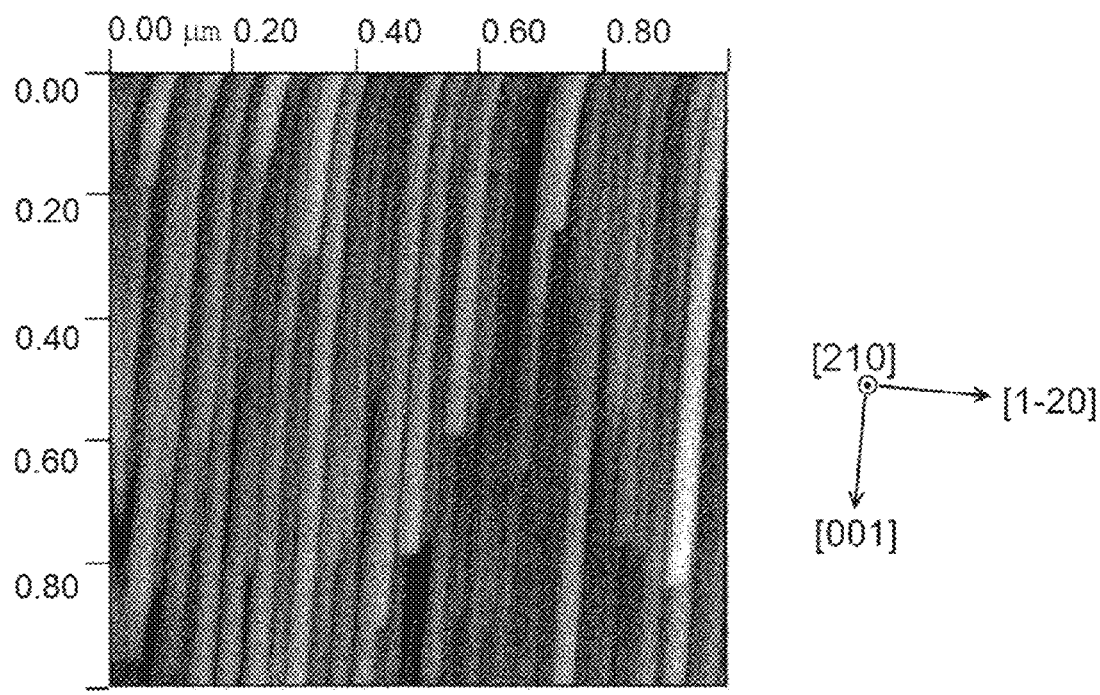
FIG. 4A is an AFM image of the surface of the annealed $SrTiO_3$ (210) oriented substrate.
Figure 4B:
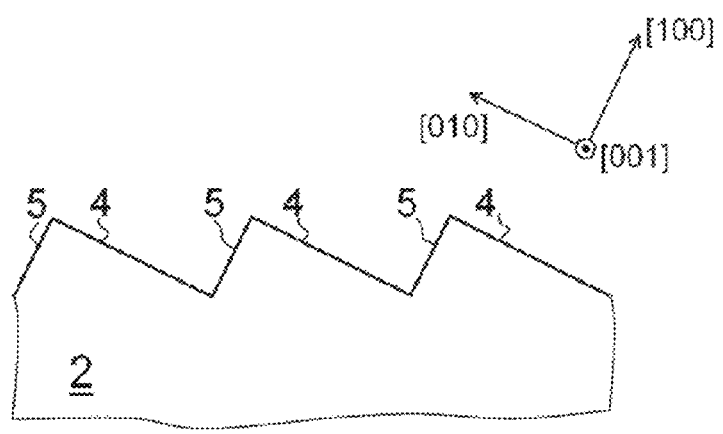
FIG. 4B is a schematic cross-section of a surface structure consisting of (100) plane terraces and steps extending in the in-plane [001] axis direction.

FIG. 4 shows the surface structure of a SrTiO$_3$ (210) oriented substrate that had been annealed for 12 hours in atmosphere at 1100° C. in an embodiment of the present invention. FIG. 4A is an AFM image of the surface of the substrate 2, which is an annealed SrTiO$_3$ (210) oriented substrate. Although each of the pixels in the original AFM image was a halftone pixel, on the paper the halftones are represented in terms of the density of fine black and white pixels. Meanwhile, FIG. 4B is a schematic cross-section showing the undulated structures in the substrate 2 seen from the in-plane [001] axis direction. As shown in FIG. 4A, multiple steps extending closely in the [001] axis direction are formed on the surface of the substrate 2 by annealing the SrTiO$_3$ (210) oriented substrate in atmosphere. Moreover, multiple terraces about 40 nm in width and over 1 μm in length are formed extending closely in the [001] axis direction on the surface of the substrate 2. In the AFM image of FIG. 4A, the measured height difference created by the steps from the profile in the [1-20] axis direction is about 3 nm. This height difference is equivalent to about 6 unit cells if converted to unit cells of SrTiO$_3$. Thus, undulated structures are formed on the substrate 2 by annealing in atmosphere. This is shown as a cross-section in FIG. 4B. The undulated structures on the surface of the substrate 2 comprise terraces 4 formed by (100) planes and steps 5 formed by (010) planes or in other words planes with a first aspect on the surface of the substrate 2. Since these undulated structures are not observed in the as-purchased SrTiO$_3$ (210) oriented substrate, they can be said to have been formed by annealing in atmosphere.

(2) SmBaMn$_2$O$_6$ Thin Film Manufacturing Method:

In this embodiment, the terraces 4 formed by (100) planes on a SrTiO$_3$ (210) oriented substrate as the substrate 2 are used as a template to form a SmBaMn$_2$O$_6$ thin film as the thin film 3. It is thus possible to order the A sites in a pattern of SmO—MnO$_2$—BaO—MnO$_2$—SmO . . . in the [100] axis direction in the thin film 3.

The thin film 3 is a SmBaMn$_2$O$_6$ thin film formed by laser ablation on the surface of the undulated structures of the substrate 2, which is a SrTiO$_3$ (210) oriented substrate. This laser ablation method uses as the target a polycrystal of SmBaMn$_2$O$_6$ prepared by a solid-phase reaction and molded into a cylindrical shape 20 mm in diameter and 5 mm long. The annealed substrate 2 is then mounted inside a vacuum chamber, which is evacuated to 3×10$^{-9}$ Torr (4×10$^{-7}$ Pa) or less. Highly pure oxygen gas is then introduced at only 0.9×10$^{-5}$ Torr (1.2×10$^{-3}$ Pa), and the vacuum chamber is adjusted to a total pressure of about 5 mTorr (0.67 Pa) by adding Ar gas. The substrate 2 is further heated to an achieved temperature of 1040° C. in this atmosphere. As discussed above, because the achieved temperature (1100° C.) of the substrate 2 during annealing is higher than the achieved substrate temperature during the growth of the SmBaMn$_2$O$_6$ thin film as the thin film 3, the undulated structures on the surface of the substrate 2 are not affected by substrate heating during the film growth.

The reason why the oxygen partial pressure and total pressure are controlled separately is so that previously established film-growth conditions can be applied when preparing the SmBaMn$_2$O$_6$ thin film of this embodiment. This point is explained in more detail. Because the A sites must be ordered in the SmBaMn$_2$O$_6$ thin film, the compositional ratio of the formed thin film needs to be as constant as possible. This is because if the compositional ratio shifts, excess elements are incorporated into the sites of their counterparts (the elements they pair with), which inevitably reduces the degree of ordering. To prevent this decrease in ordering by precisely determining the film-growth conditions without relying on background knowledge is an extremely time-consuming process. Thus, it was thought that if it were possible to apply previously-established film-growth conditions, or in other words to exploit the film-growth conditions established for ordinary SmBaMn$_2$O$_6$ perovskite manganese oxides, such compositional shifts could be effectively prevented.

More specifically, performing A-site ordering by laser ablation involves a two-stage process. In the first stage (first step), the larger ion radius of the Ba ion is used to form a pyramidal structure with SmO plane oxygen deficiencies in the positions that normally form the oxygen octahedral. This is a step of using electrostatic differences to form an A-site ordered structure. The second stage (second step) is a stage of filling the oxygen deficiencies created in the first stage. When using this step-by-step process, processing in the first stage must be carried out in a reducing atmosphere. Oxygen is commonly used alone as the introduced gas when this processing in a reducing atmosphere in the first stage is performed by a conventional laser ablation method. When it has been necessary to form the film in a reducing atmosphere, the film-growth conditions have then been changed so as to simply lower the oxygen partial pressure. However, changing the conditions in this way also changes the plume shape during laser ablation. The plume here means the balloon-shaped plasma generated during laser ablation, and bias of composition is unavoidable in this plasma. A change in plume shape caused by decreasing the oxygen partial pressure also changes the position where the plume impacts the substrate, causing a problem of discrepancies in the film-growth conditions related to composition, or in other words compositional shifts.

The researches of the inventor of this application have revealed a technique for preventing compositional shifts without changing the plume shape even while lowering the oxygen partial pressure. Previously, no special attention has been paid to the other changes that occur when the oxygen partial pressure is lowered, and the total pressure of the atmosphere has also been changed. The aforementioned changes in plume shape are greatly affected by this total pressure, and it has been shown that if the total pressure can be maintained at a suitable value while lowering the oxygen partial pressure, the plume shape is much less affected. Therefore, previously established film-growth conditions can be applied to the preparation of the $SmBaMn_2O_6$ thin film (thin film 3) of this embodiment if the thermodynamically required oxygen partial pressure and the total pressure required for maintaining the characteristic plume shape for laser ablation can be controlled independently.

The aforementioned two-stage film-growth method in which the oxygen partial pressure and total pressure are each controlled independently in the first step is also applied to the thin film 3 of this embodiment. In the first step, the oxygen partial pressure and total pressure are first controlled, and the target is then exposed to a 248 nm KrF excimer laser through the chamber's laser beam entry port, to hereby form a $SmBaMn_2O_6$ thin film with a film thickness of about 40 nm. The surface of the thin film is observed in situ during thin film growth by RHEED (reflection high-energy electron diffraction). Because the (210) substrate is anisotropic, information about the (1-20) plane is obtained as a diffraction pattern when an electron beam is directed parallel to the in-plane [001] axis. Similarly, information about the in-plane (001) plane is obtained as a diffraction pattern when the beam is directed parallel to the in-plane [1-20] axis. When an electron beam is directed parallel to the in-plane [1-20] axis, the observed RHEED pattern of Laue spots and streaks is similar to that of a thin film formed on a (100) oriented substrate, indicating epitaxial growth of a flat thin film on a nanometer scale on the substrate.

As the second step, the thin film after growth is annealed in-situ at 400 C to fill the oxygen deficiencies. The $O_2$/Ar ratio of the annealing atmosphere is adjusted carefully so as not to disrupt the A-site ordering. A different method of performing the second step is to remove the substrate 2 with the formed film 3 from the vacuum chamber, and then fill the oxygen deficiencies by post-annealing. It has been confirmed that $N_2O$ is desirable as the atmospheric gas in this case, because it allows the oxygen deficiencies to be filled without disrupting the A-site ordering.

(3) Examples

The present invention is explained in more detail below by means of examples. The materials, amounts, proportions, processing methods, procedures, and aspects or specific arrangements of elements or parts and the like in the following examples can be changed appropriately as long as the intent of the present invention is not violated. Consequently, the scope of the present invention is not limited to the following specific examples. Samples of the examples were prepared in accordance with the manufacturing methods described above. In the samples of the examples, an $SmBaMn_2O_6$ thin film was formed as the thin film 3 on the substrate 2, which was a $SrTiO_3$ (210) oriented substrate with the aforementioned undulated structures formed on its surface.

In the samples of the examples prepared under conditions such that the thickness of the thin film 3 was less than the height difference of the undulated structures on the substrate 2, the surface of the formed thin film 3 was observed by AFM. In this case, undulated structures comprising (100) plane terraces and steps extending in the in-plane axis direction were confirmed on the surface of the thin film 3 as they were on the substrate 2. Next, when reciprocal lattice space mapping around (211) and (310) was performed by 4-circle X-ray diffraction, the thin film 3 was found to have been grown coherently as a single-crystal thin film on the substrate 2 even when growth was in the [100] axis direction. A-site ordering was confirmed from the presence or absence of a superlattice peak in selected-area electron beam diffraction using an electron microscope.

(3-1) Aspect of Charge and Orbital-Ordered Plane:

The A-site ordering and the disposition of the charge- and orbital-ordered plane 1 in the thin film 3 ($SmBaMn_2O_6$ thin film) grown with a [100] axis orientation on the terrace planes formed by the (100) plane are explained next. The crystal lattice is explained based on $LnBaMn_2O_6$ so as not to lose generality. An example with a [210] axis growth direction is also explained for purposes of comparison.

Figure 5A:
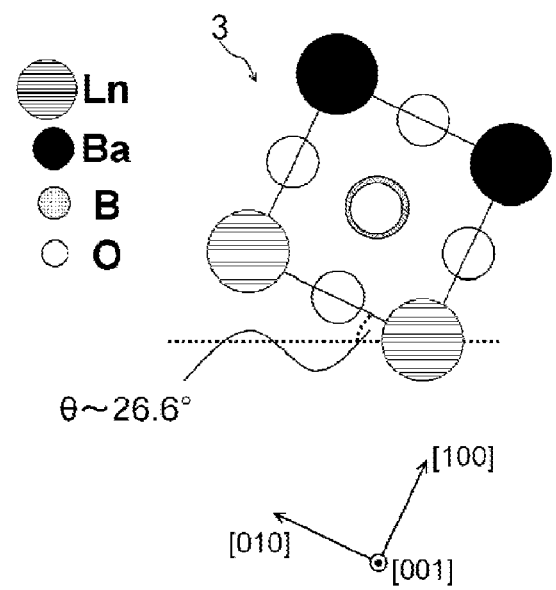
FIG. 5A is a side view seen from the in-plane [001] axis.
Figure 5B:
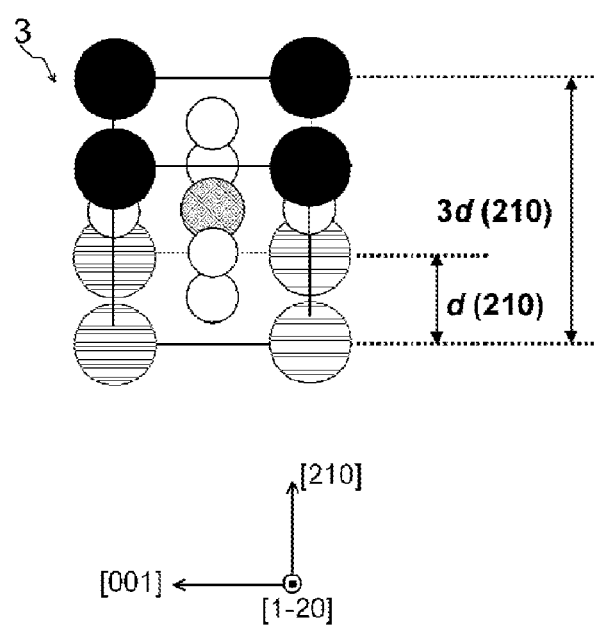
FIG. 5B is a side view seen from the in-plane [1-20] axis.
Figure 6:
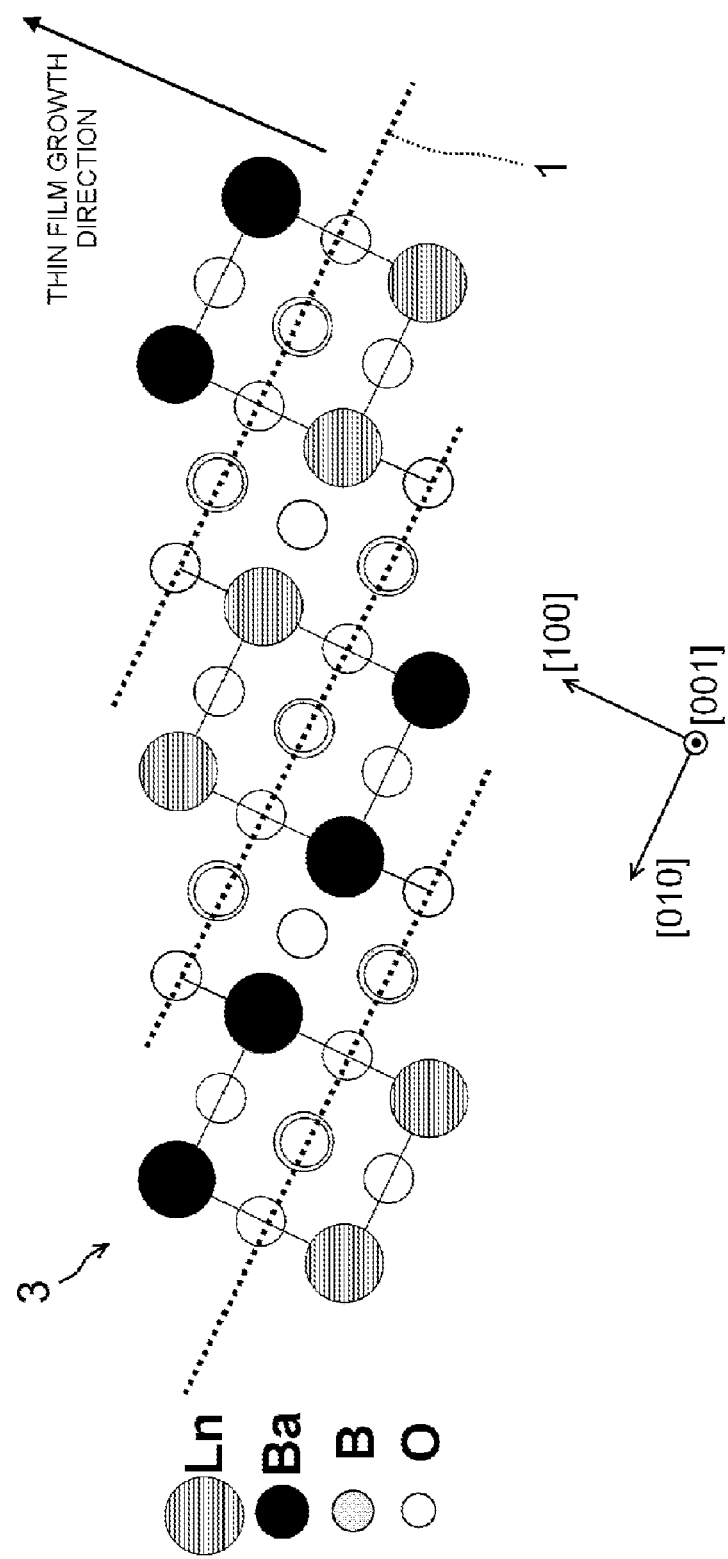
FIG. 6 is a side view showing an enlargement of part of an $LnBaMn_2O_6$ thin film grown in the [100] axis direction on a $SrTiO_3$ (210) oriented substrate in an embodiment of the present invention.

(3-1-1) Aspect of Charge- and Orbital-Ordered Plane in Example:

FIG. 5 is a side view of an A-site ordered $LnBaMn_2O_6$ crystal lattice, in which atomic planes with the rare earth element Ln and alkaline-earth element Ba in the A sites assume a stacked structure of LnO—$MnO_2$—BaO— . . . in the [100] axis direction. In particular, FIG. 5A is a side view seen from the in-plane [001] axis and FIG. 5B is a side view seen from the in-plane [1-20] axis, and these images are drawn using the same conventions used in explaining the perovskite structure in FIGS. 2A and 2B. The difference from FIG. 2 is that in the thin film 3, the A sites are ordered with growth in the [100] axis direction. The charge- and orbital-ordered plane 1 in a thin film 3 formed with such an A-site ordering pattern is inclined at an angle of about 26.6 degrees, which is in the parallel range of the substrate as shown in FIG. 6.

Figure 7A:
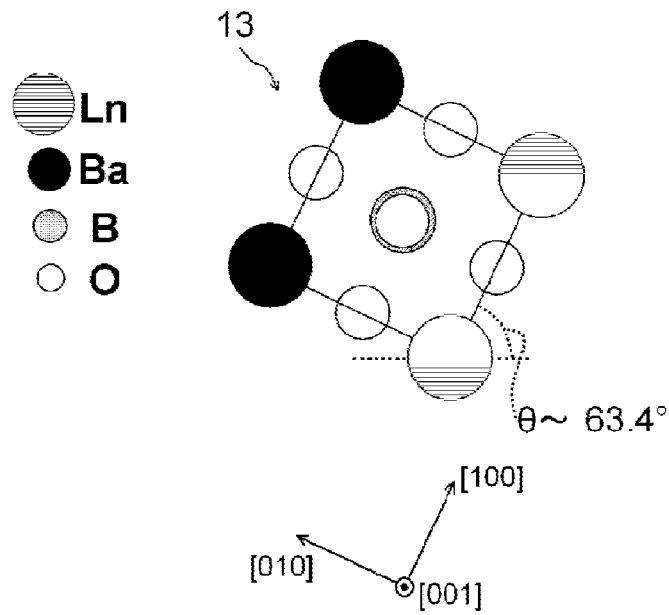
FIG. 7A is a side view seen from the in-plane [001] axis.
Figure 7B:
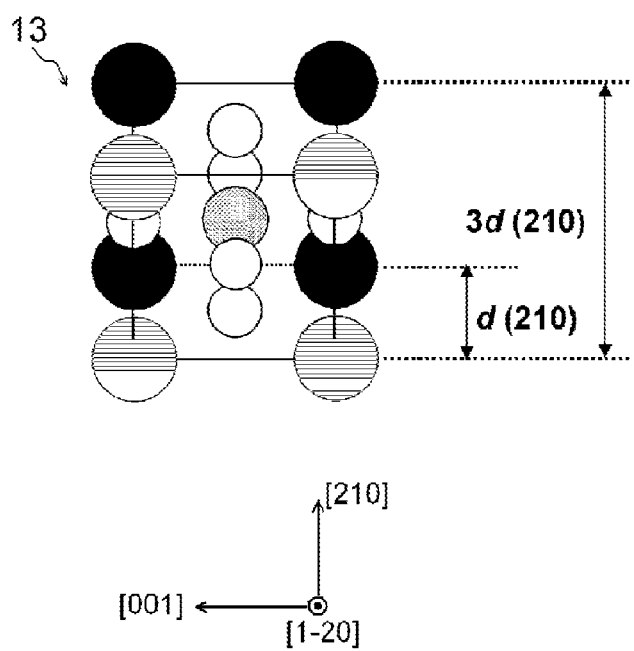
FIG. 7B is a side view seen from the in-plane [1-20] axis.

(3-1-2) Aspect of Charge- and Orbital-Ordered Plane in Comparative Example:

By contrast, even using a thin film of the same material, the aspect of the charge- and orbital-ordered plane is different when the growth direction is the [210] axis direction. As a comparative example, FIG. 7 shows the structure of a thin film 13, which is an A-site ordered $SmBaMn_2O_6$ thin film grown in the [210] axis direction on a (210) oriented substrate. This is also illustrated based on $LnBaMn_2O_6$. When growth is in the [210] axis direction, the pattern of A-site ordering in the $LnBaMn_2O_6$ thin film is different from that of the example shown in FIG. 6. Specifically, the charge- and orbital-ordered plane 11 of the thin film 13 is inclined at a larger angle relative to the substrate plane as shown in FIG. 8, in the perpendicular range of the substrate. In this case, the charge- and orbital-ordered plane 11 forms an angle of about 63.4 degrees to the substrate plane. As-purchased SrTiO$_3$ (210) oriented substrate that was flat on a nanometer scale but not with a stepped structure was used to grow the SmBaMn$_2$O$_6$ thin film (LnBaMn$_2$O$_6$ thin film) along the [210] axis direction.

As explained in the example above, a thin film in which the charge- and orbital-ordered plane 1 is disposed in the parallel range of the substrate plane can be obtained by growing the thin film on (100) plane terraces on the surface of a SrTiO$_3$ (210) oriented substrate, using undulated structures comprising steps formed by planes with a first aspect extending in the in-plane [001] axis direction and the (100) plane terraces, which have a different aspect from the first aspect.

(3-2) Comparison of Samples of Example and Comparative Example:

The occurrence of a first order phase transition due to appearance and extinction of charge- and orbital-ordering in the thin films of the samples of the example and comparative example, which have different alignments of the charge- and orbital-ordered plane, was investigated in terms of the temperature dependence and magnetic field dependence of electrical resistance.

First, resistance was measured as the temperature was raised from room temperature (300 K) to 400 K, and each sample was confirmed to exhibit a clear resistance change near 390 K, evidence for a first order transition due to charge- and orbital-ordering.

Next, two different thin films prepared in the same way as the aforementioned example and comparative example on Nb-doped SrTiO$_3$ (210) oriented substrates were measured to investigate the difference in resistance in the direction of film thickness between the thin film of the example, in which the charge- and orbital-ordered plane was in the parallel range of the substrate plane, and the thin film of the comparative example, in which the plane was in the perpendicular range. First, when resistance was measured without a magnetic film at room temperature (300 K) in the charge- and orbital-ordered phase, the resistance value of the thin film of the example, in which the charge- and orbital-ordered plane was in the parallel range of the substrate plane, exhibited twice the resistance of the thin film of the comparative example, in which the charge- and orbital-ordered plane was in the perpendicular range of the substrate plane. Next, A magnetic field of 9 T was applied as an external field to change the electron phase of the SmBaMn$_2$O$_6$ from a charge- and orbital-ordered phase to a metallic phase, and resistance was measured in the same way. The resistance value at room temperature (300 K) under this external field was smaller than before application of the magnetic field in both the example and comparative example, and the resistance value of the example was roughly the same as that of the comparative example. The inventor attributes this to the fact that the anisotropy provided by the charge- and orbital-ordered plane is extinguished in the metallic phase induced by the magnetic field. Thus, the properties of the thin films of the example and comparative example are compared in terms of the amount of change in resistance between the resistance value of the charge- and orbital-ordered phase or in other words the insulating phase without the magnetic field, and the resistance value in the metallic phase induced by the magnetic field. It was thus confirmed that the amount of resistance change differs depending on the orientation of the charge- and orbital-ordered plane relative to the direction of film thickness (the pathway of the measured current), and that the amount of change in this resistance was greater in the thin film of the example than in the comparative example.

The reason why switching was investigated using a magnetic field in this comparison has to do with the properties of SmBaMn$_2$O$_6$. That is, the electron phase of SmBaMn$_2$O$_6$ without an applied magnetic field transitions at 380 K from a charge- and orbital-ordered phase at low temperatures to a phase without charge- and orbital-ordering at higher temperatures. However, this electron phase at high temperatures is classified as an insulator phase as defined in this application based on the derivative of electrical resistance. That is, in switching according to temperatures, even if appearance and extinction of the charge- and orbital-ordered phase occurs, the electrical properties are limited to a transition between insulator phase and insulator phase. As a result, a transition (switching) of the charge- and orbital-ordered phase from an insulator phase to a metallic phase was induced with a magnetic field at room temperature (300 K) to investigate the effect of the aspect of the charge- and orbital-ordered phase on the transition.

As discussed above, in a thin film of perovskite manganese oxide grown in the direction of the [100] axis on the (100) plane of a SrTiO$_3$ (210) oriented substrate, the A sites can be ordered because the atomic stacking planes are in an AO-BO$_2$-AO pattern, and a first order phase transition is possible because the in-plane symmetry is broken. In this thin film, the resistance value of the charge- and orbital-ordered insulator phase is not reduced because the charge- and orbital-ordered plane is in the parallel range of the substrate plane. As a result, in the thin film of this embodiment with the charge- and orbital-ordered plane in the parallel range of the substrate plane, the resistance change originally exhibited by perovskite manganese oxides can be thoroughly exploited for purposes of switching using an electronic phase transition involving the appearance and extinction of charge- and orbital-ordering at room temperature even when the oxide is in thin film form.

In the embodiment described above, the growth direction of the film was controlled in the [210] axis direction by using the terrace parts of the undulated structures formed by annealing on the (210) oriented SrTiO$_3$ (210) oriented substrate. Similar effects can be expected in thin films with (m10) orientations (19≥m≥3). Thus, effects similar to those of the present embodiments can be expected with all (m10) oriented (19≥m≥2) substrates and thin films.

The materials and compositions, film thicknesses, formation methods and the like of the thin films and substrates given as examples in this embodiment are not limited to the present embodiment. The names given to the axes and planes of the perovskite crystals for purposes of explanation can also be changed to other equivalent expressions known to those skilled in the art. For example, even when a crystal axis on the substrate plane is called the axis as in the explanations above, the crystal axes can still be applied in different ways, and four different equivalent arrangements are conceivable. As a result, a plane that is called the (m10) plane based on a particular axis in the right-hand system for example may be indexed as the (1m0) plane based on a different axis in the right-hand system. Thus, it must be remembered that equivalent planes may be described differently.

Embodiments of the present invention were explained above. Each of the embodiments and examples above was described in order to explain the invention, and the scope of the invention of this application should be determined based on the descriptions of the Claims. Modified examples within the scope of the present invention including other combinations of these embodiments are encompassed by the Claims.

The present invention can be applied to a device using a perovskite manganese oxide thin film the electrical, magnetic or optical properties of which manifest phase transitions and switching phenomena in response to temperature, electrical field, magnetic field or light exposure.

The invention claimed is:

1. An article including a perovskite manganese (Mn) oxide thin film, comprising:
   a substrate having an oriented perovskite structure that is (m10) oriented, where $19 \geq m \geq 2$, and having an [100] axis direction; and
   a perovskite manganese (Mn) oxide thin film having a perovskite crystal lattice comprised of barium Ba and a rare earth element Ln in A sites of the perovskite crystal lattice, the perovskite manganese (Mn) oxide thin film being formed on the substrate so as to cover at least part of a surface of the substrate, and having atomic planes stacked in a pattern of LnO—MnO$_2$—BaO—MnO$_2$-LnO . . . in the [100] axis direction of the substrate.

2. The article according to claim 1, wherein the substrate is a (210) oriented substrate.

3. The article according to claim 2, wherein the substrate is comprised of SrTiO$_3$ and is a SrTiO$_3$ (210) oriented substrate, and wherein the substrate has an undulated structure on the surface on which the perovskite manganese (Mn) oxide thin film is formed, the undulated structure comprising steps formed by planes that have a first aspect extending in an in-plane [001] axis direction; and terraces formed by (100) planes that have an aspect that is different from the first aspect.

4. The article according to claim 1, wherein the perovskite manganese (Mn) oxide thin film is represented by a chemical formula SmBaMn$_2$O$_6$.

5. The perovskite manganese oxide thin film according to claim 2, wherein the perovskite manganese (Mn) oxide thin film is represented by a chemical formula SmBaMn$_2$O$_6$.

6. The perovskite manganese oxide thin film according to claim 3, wherein the perovskite manganese (Mn) oxide thin film is represented by a chemical formula SmBaMn$_2$O$_6$.

* * * * *